(12) United States Patent
Tsao et al.

(10) Patent No.: US 7,920,386 B2
(45) Date of Patent: Apr. 5, 2011

(54) ELECTRONIC DEVICE

(75) Inventors: Lu-Lung Tsao, Taipei County (TW);
Cheng-Yuan Yang, Taipei County (TW);
Li-Wei Cheng, Taipei County (TW)

(73) Assignee: Quanta Computer Inc., Tao Yuan Shien (TW)

( * ) Notice: Subject to any disclaimer, the term of this patent is extended or adjusted under 35 U.S.C. 154(b) by 133 days.

(21) Appl. No.: 12/436,856

(22) Filed: May 7, 2009

(65) Prior Publication Data
US 2010/0214757 A1 Aug. 26, 2010

(30) Foreign Application Priority Data

Feb. 20, 2009 (TW) ................................ 98105424 A

(51) Int. Cl.
*H05K 5/00* (2006.01)
(52) U.S. Cl. ........ 361/755; 361/686; 361/752; 439/131; 439/136
(58) Field of Classification Search .................. 361/755, 361/686, 752; 439/131, 136
See application file for complete search history.

(56) References Cited

U.S. PATENT DOCUMENTS

| | | | | |
|---|---|---|---|---|
| 4,265,051 A * | 5/1981 | Williams | ............................. | 49/7 |
| 4,470,625 A * | 9/1984 | Walsh et al. | ................... | 292/201 |
| 4,485,988 A * | 12/1984 | Kikuya et al. | ................ | 242/338 |
| 4,604,772 A * | 8/1986 | Arff | ............................... | 24/68 R |
| 4,909,562 A * | 3/1990 | Sakuma et al. | .............. | 296/97.5 |
| 4,993,758 A * | 2/1991 | Schmutzler | .................... | 292/152 |
| 5,987,122 A * | 11/1999 | Daffara et al. | ........... | 379/433.13 |
| 6,758,689 B1 * | 7/2004 | Bair et al. | ...................... | 439/136 |
| 6,975,274 B2 * | 12/2005 | Sanchez et al. | ............... | 343/702 |
| 7,064,285 B2 * | 6/2006 | Ichimaru | ........................ | 200/293 |
| 7,462,044 B1 * | 12/2008 | Regen et al. | ................... | 439/131 |
| 7,530,823 B1 * | 5/2009 | Thornton et al. | ............. | 439/136 |
| D606,078 S * | 12/2009 | Chen | .......................... | D14/480.6 |
| 2001/0027448 A1 * | 10/2001 | Schor et al. | .................... | 705/401 |
| 2005/0252759 A1 * | 11/2005 | Ichimaru | ....................... | 200/523 |
| 2006/0131431 A1 * | 6/2006 | Finn | ................................ | 235/492 |
| 2006/0155913 A1 * | 7/2006 | Nishikawa et al. | ........... | 711/100 |
| 2007/0182868 A1 * | 8/2007 | Yang | ............................. | 348/731 |
| 2008/0026614 A1 * | 1/2008 | Emerson et al. | .............. | 439/136 |
| 2008/0192149 A1 * | 8/2008 | Lee | ................................ | 348/725 |

* cited by examiner

*Primary Examiner* — Xiaoliang Chen
(74) *Attorney, Agent, or Firm* — Thomas, Kayden, Horstemeyer & Risley

(57) ABSTRACT

An electronic device is provided. The electronic device includes a housing, a rotating mechanism and a first rotating member. The rotating mechanism, rotatably disposed in the housing, rotatable along a first direction and a second direction different from the first direction. The first rotating member, disposed on the housing, rotatable between a first position and a second position. When the first rotating member is in the first position, the first rotating member engages with the rotating mechanism. When the rotating mechanism rotates along the first direction, the rotating mechanism is separated from the first rotating member, whereinafter, the first rotating member is able to rotate from the first position to the second position.

18 Claims, 6 Drawing Sheets

ELECTRONIC DEVICE

This Application claims priority of Taiwan Patent Application No. 098105424, filed on Feb. 20, 2009, the entirety of which is incorporated by reference herein.

BACKGROUND OF THE INVENTION

1. Field of the Invention

The invention relates to an electronic device, and in particular, to a wireless data card with an automatically raising antenna.

2. Description of the Related Art

Data cards function for data transmission. When data cards are connected to a computer, the computer may be provided with mobile communications. The data card may be a wireless data card, which requires an antenna to transmit signals. For conventional data cards, the antenna is usually built into the housing, or connected on an exterior of the housing by a telescopic link. However, the built-in antenna may not provide high communications quality. Additionally, the telescopic antenna is not only inconvenient for users when carried, but also requires manual operation to be extracted and retracted.

BRIEF SUMMARY OF THE INVENTION

Accordingly, an electronic device is provided. The electronic device includes a housing, a rotating mechanism and a first rotating member. The rotating mechanism, rotatably disposed in the housing, rotatable along a first direction and a second direction different from the first direction. The first rotating member, disposed on the housing, rotatable between a first position and a second position. When the first rotating member is in the first position, the first rotating member engages with the rotating mechanism. When the rotating mechanism rotates along the first direction, the rotating mechanism is separated from the first rotating member, whereinafter, the first rotating member is able to rotate from the first position to the second position.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

Figure 1:
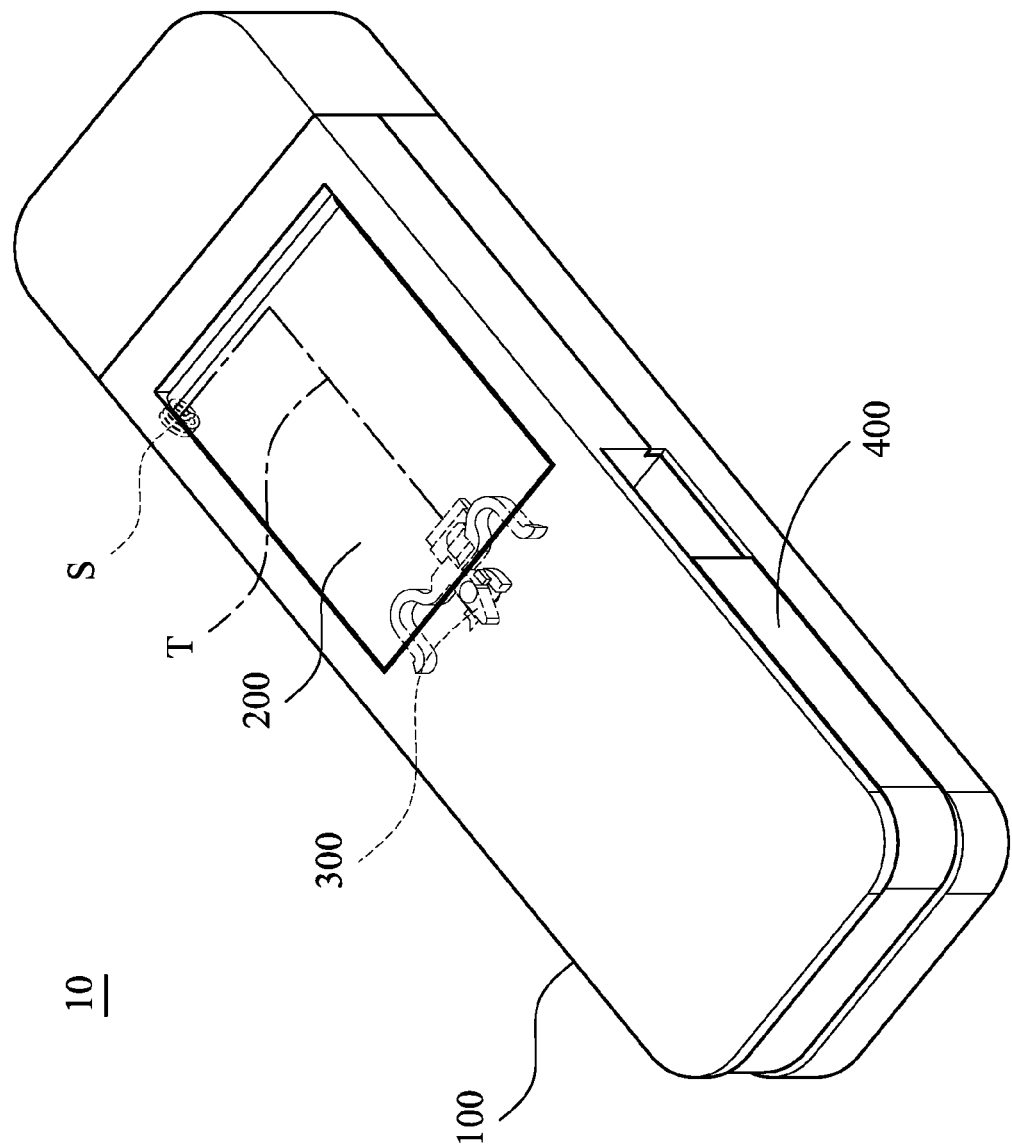
FIGS. 1-3 are schematic views of an electronic device showing operation of a first rotating member and a second rotating member.
Figure 2:
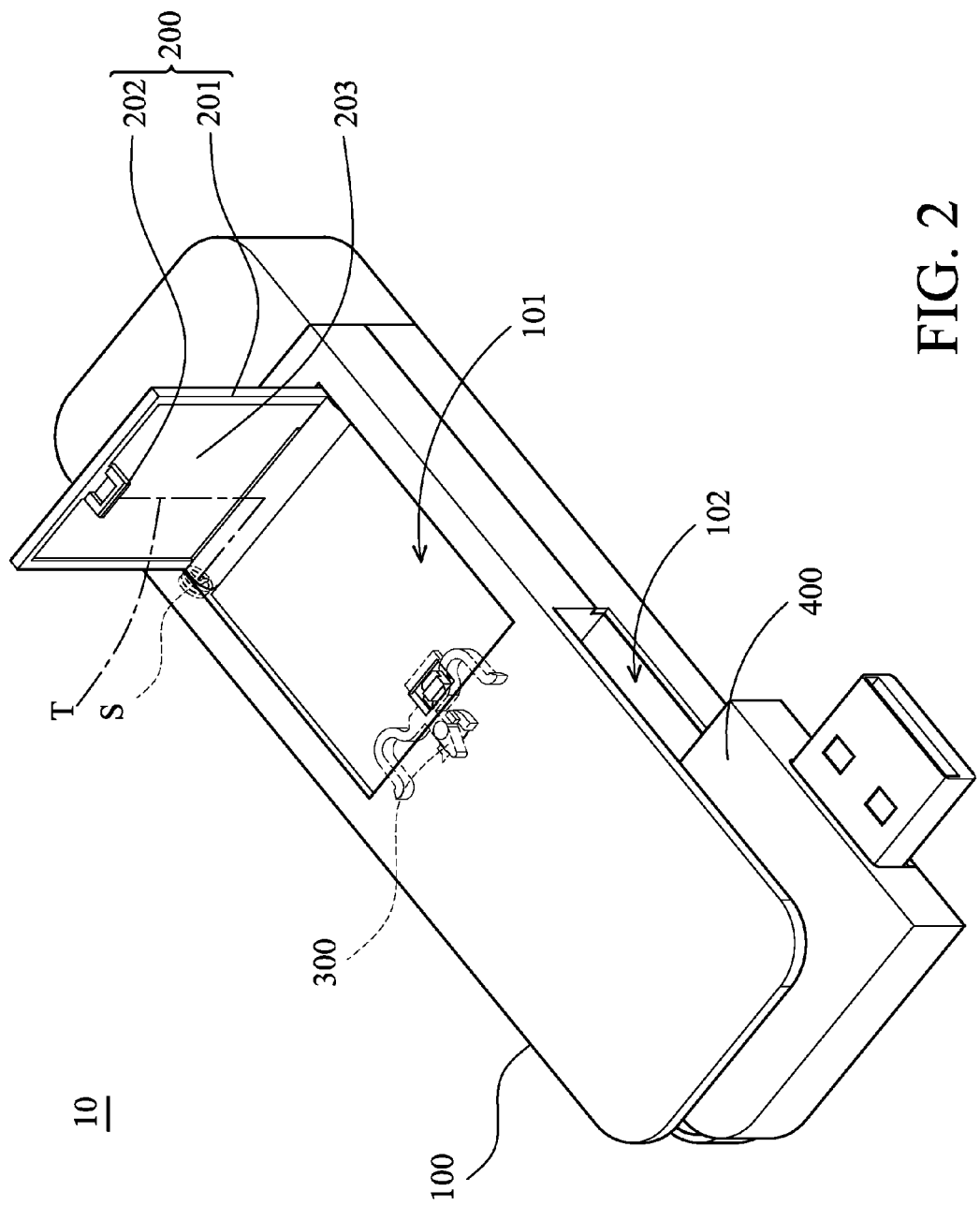
Figure 3:
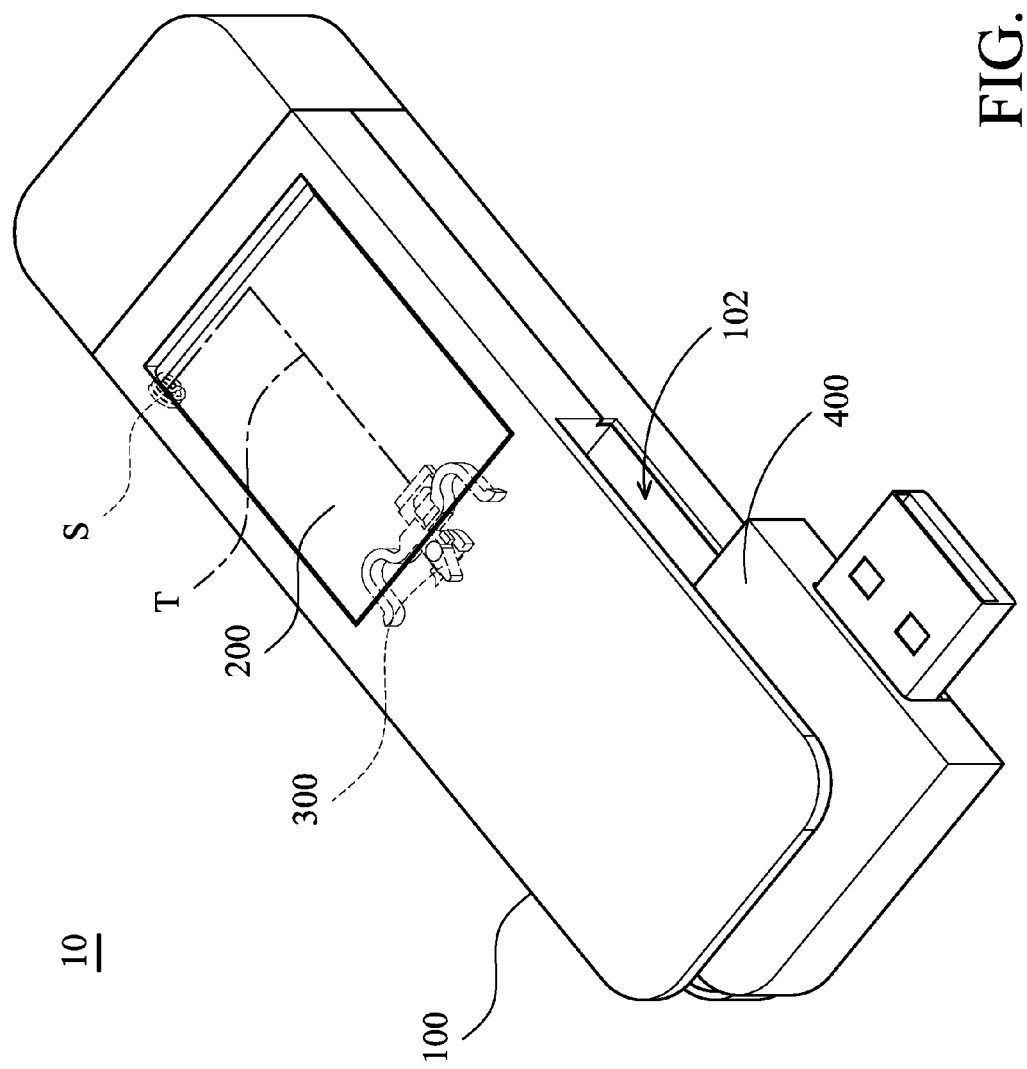

FIGS. 1-3 are schematic views of an electronic device showing operation of a first rotating member and a second rotating member. Referring to FIGS. 1 to 3, an electronic device 10 of the invention is a wireless data card, comprising a housing 100, a first rotating member 200, an antenna structure T, an elastic member S, a rotating mechanism 300 and a second rotating member 400. The housing 100 comprises a recess 101 (as shown in FIG. 2) corresponding to the first rotating member 200, and an accommodating portion 102 corresponding to the second rotating member 400, wherein the recess 101 and the accommodating portion 102 are extended to an interior from an exterior surface of the housing 100.

The first rotating member 200 is rotatably disposed on the housing 100, rotating between a first position and a second position, and the antenna structure T is provided in the first rotating member 200. When the first rotating member 200 is in the first position, the first rotating member 200 is stored in the recess 101 of the housing 100 (as shown in FIG. 1 and FIG. 3) in a stored status. When the first rotating member 200 is in the second position, the first rotating member 200 is rotated relatively to the housing 100 by substantially ninety degrees, activating the antenna structure T to flip out of the recess 101 by the elastic member S (as shown in FIG. 2). In an embodiment, the antenna structure T is provided on an inner surface 203 of the first rotating member 200.

The elastic member S is disposed between the first rotating member 200 and the housing 100. When the first rotating member 200 is rotated from the second position to the first position, an elastic force is accumulated within the elastic member S used to push the first rotating member 200 rotating from the first position to the second position when the elastic force is released. In an embodiment, the elastic member is a torsion spring or a coil spring.

Figure 4:
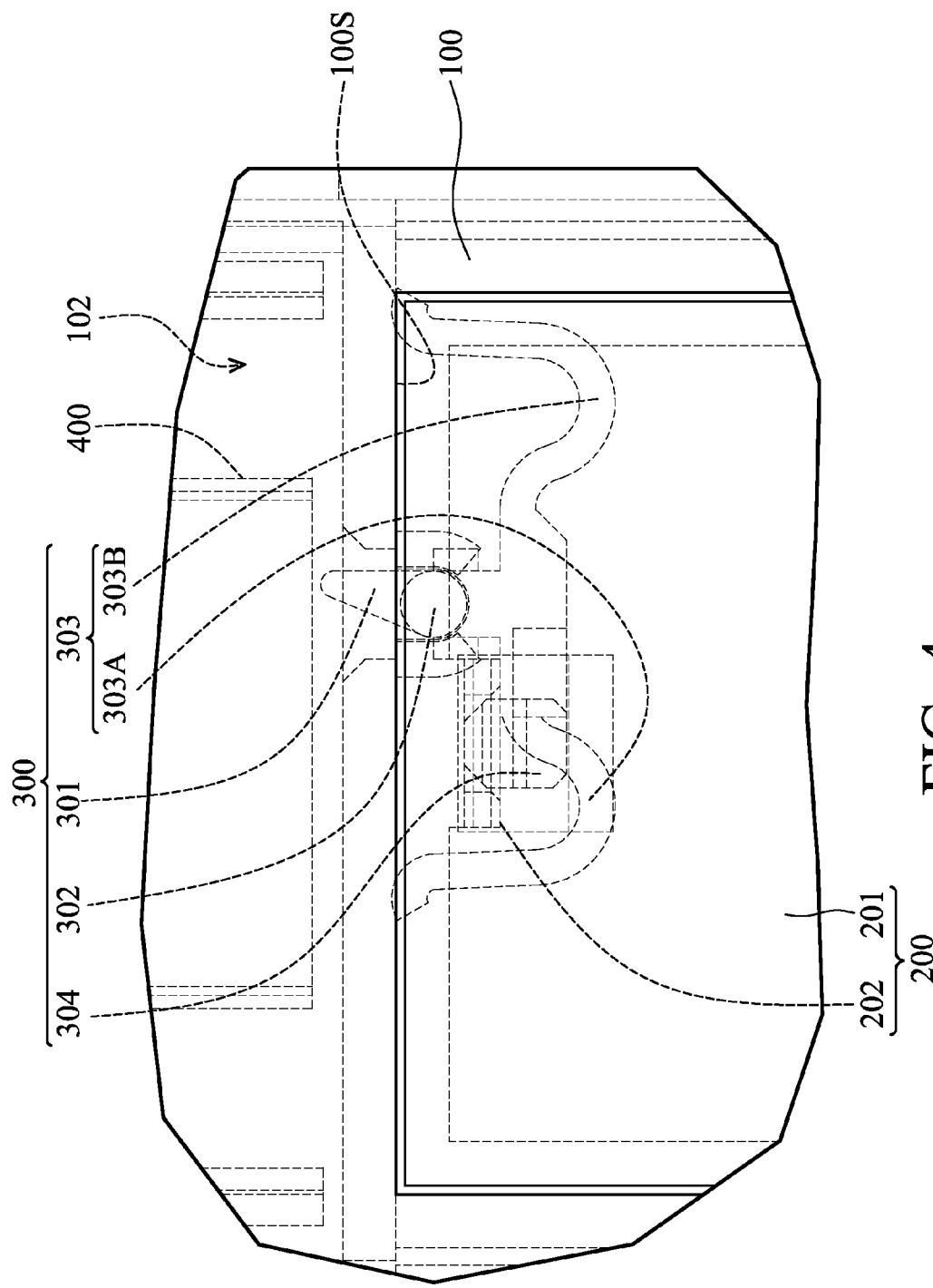
FIGS. 4-6 are schematic views of the electronic device showing operation of a rotating mechanism.
Figure 5:
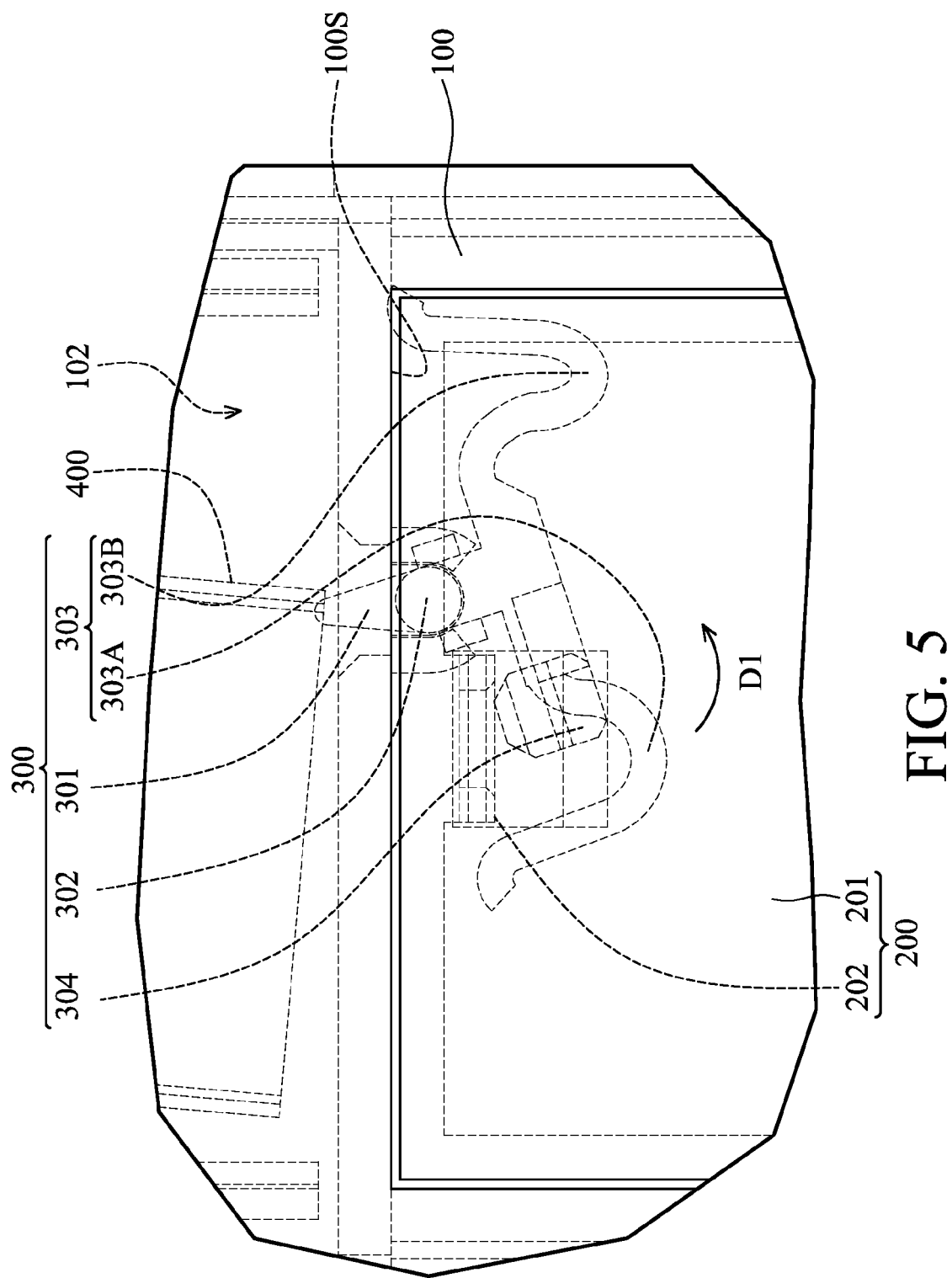
Figure 6:
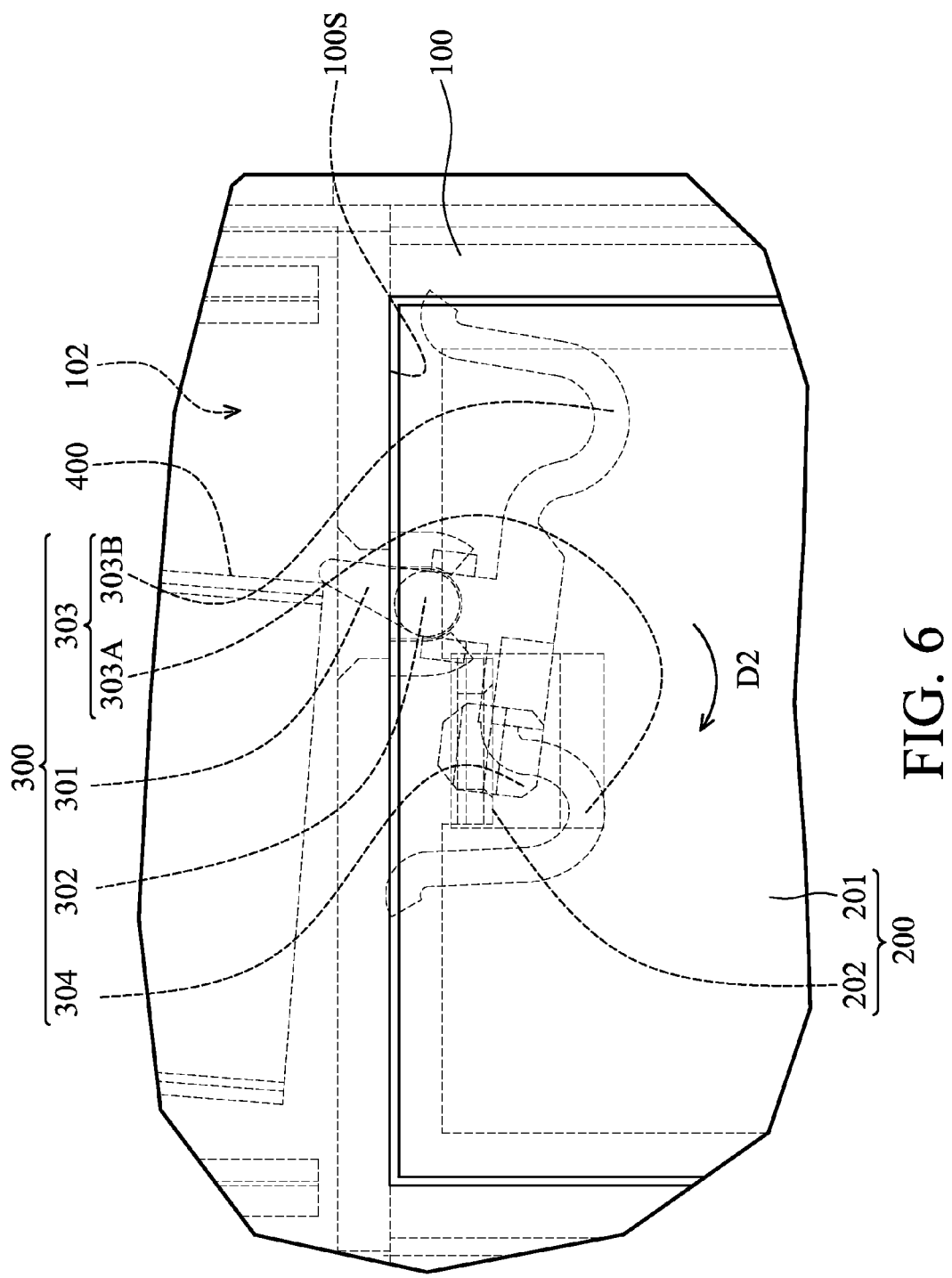

FIGS. 4-6 are schematic views of the electronic device showing operation of a rotating mechanism. Referring to FIGS. 4 to 6, the rotating mechanism 300, rotatably disposed in the housing 100, rotating along a first direction D1 (as shown in FIG. 5) and a second direction D2 (as shown in FIG. 6) is shown. The rotating mechanism 300 comprises a protrusion 301, an axle 302, an elastic arm set 303 and an engaging portion 304. The protrusion 301 and the elastic arm set 303 are connected to the axle 302 respectively, and the protrusion 301 extends into the accommodating portion 102 from an interior of the housing 100. The elastic arm set 303 comprises a first elastic arm 303A and a second elastic arm 303B. The first elastic arm 303A and the second elastic arm 303B are symmetrically disposed on two sides of the protrusion 301, and respectively abut an interior surface 100S of the housing 100. The engaging portion 304 is disposed corresponding to a corresponding engaging portion 202 of the first rotating member 200. In an embodiment, the engaging portion 304 is disposed on the first elastic arm 303A.

Referring to FIG. 2 and FIG. 4 simultaneously, the first rotating member 200 comprises a main body 201 and the corresponding engaging portion 202. The corresponding engaging portion 202 is disposed on the inner surface 203 of the main body 201, corresponding to the engaging portion 304 of the rotating mechanism 300. When the first rotating member 200 is in the first position (as shown in FIG. 1), the corresponding engaging portion 202 enters into the recess 101 and engages with the engaging portion 304 of the rotating mechanism 300 (as shown in FIG. 4).

Referring to FIG. 1 to FIG. 3 again, the second rotating member 400 comprises an interface with hot swap ability, such as a universal serial bus port (USB port), an IEEE-1394 interface or a serial advanced technology attachment (Serial ATA) which is connectable with an external electronic device. The second rotating member 400, rotatably disposed on the housing 100, is able to be received in the accommodating portion 102 (as shown in FIG. 1), or to rotate from the interior of the accommodating portion 102 to the exterior of the accommodating portion 102 (as shown in FIG. 2 and FIG. 3). Referring to FIGS. 5 and 6, when the second rotating member 400 is rotated from the interior of the accommodating portion 102 to the exterior of the accommodating portion 102, due to the interference with the protrusion 301, the rotating mechanism 300 is rotated along the first direction D1 (as shown in FIG. 5). Conversely, when the second rotating member 400 is rotated from the exterior of the accommodating portion 102 to the interior of the accommodating portion 102, the protrusion 301 is pushed to rotate the rotating mechanism 300 along the second direction D2 (as shown in FIG. 6).

The operation of the electronic device is described as follows. As shown in FIGS. 1 and 4, the electronic device 10 is in a stored status, that the first rotating member 200 and the second rotating member 400 are respectively received in the recess 101 and the accommodating portion 102, and the engaging portion 202 engages with the corresponding engaging portion 304. A user may rotate the second rotating member 400 out of the accommodating portion 102. As shown in FIG. 5, during the rotation, the second rotating member 400 pushes the protrusion 301 of the rotating mechanism 300, and the rotating mechanism 300 is rotated along the first direction D1 (as shown in FIG. 2 and FIG. 5), thus separating the engaging portion 304 with the corresponding engaging portion 202. Furthermore, the second elastic arm 303B is pushed to abut the interior surface 100S of the housing 100, thus storing a potential energy. After the engaging portion 304 is separated from the corresponding engaging portion 202, the elastic force accumulated in the elastic member S is released, thereby rotating the first rotating member 200 from the first position to the second position automatically, and the antenna structure T is flipped out simultaneously. Next, the second elastic arm 303B is restored by its potential energy, rotating the rotating mechanism 300 to its original position. Meanwhile, the electronic device 10 provides the antenna structure T at a receiving position.

As shown in FIG. 3, if the user is not satisfied with the communication quality, the user could rotate the first rotating member 200 from the second position back to the first position, engaging the corresponding engaging portion 202 with the engaging portion 304 again. In this case, the electronic device 10 provides the antenna structure T at another receiving position. Finally, if the user wants to receive the electronic device 10, the user may rotate the second rotating member 400 from the exterior of the accommodating portion 102 to the interior of the accommodating portion 102 to store the second rotating member 400. As shown in FIG. 6, during the rotation, the second rotating member 400 pushes the protrusion 301 of the rotating mechanism 300, and the rotating mechanism 300 is rotated along the second direction D2. When the rotating mechanism 300 rotates along the second direction D2, the second elastic arm 303B is pushed to abut the interior surface 100S of the housing 100, thus storing a potential energy. In other words, the engaging portion 304 on the first elastic arm 303A moves toward the interior surface 100S and does not disengage with the corresponding engaging portion 202. Therefore, the first rotating member 200 does not flip out, and the rotating mechanism 300 is rotated to its original position by the potential energy stored in the second elastic arm 303B. In an embodiment, the elastic arm set 303 is a resilient member or a plastic member.

The electronic device 10 (a wireless data card) of the invention utilizes the rotation of the second rotating member 400 to trigger the first rotating member 200, resulting automatically raising of the antenna structure T. Only single action is required for the antenna structure T to rise, increasing overall convenience. Additionally, when the electronic device 10 connects with the external electronic device, the antenna structure T is provided with two different receiving positions, allowing the user to choose a preferred receiving position.

Moreover, when the first rotating member 200 is stored, it flushes with the housing 100, which is convenient for users when carried.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An electronic device, comprising:
    a housing having an accommodating portion;
    a rotating mechanism rotatably disposed in the housing, rotatable along a first direction and a second direction different from the first direction,
    and comprising a protrusion extending into the accommodating portion;
    a first rotating member disposed on the housing, rotatable between a first position and a second position; and
    a second rotating member, selectively received in the accommodating portion or rotated out of the accommodating portion, and rotatably disposed on the housing, wherein the second rotating member pushes the rotating mechanism to rotate along the first direction while rotating;
    wherein when the first rotating member is in the first position, the first rotating member engages with the rotating mechanism, and when the rotating mechanism rotates along the first direction, the rotating mechanism is separated from the first rotating member, the first rotating member is rotated from the first position to the second position.

2. The electronic device as claimed in claim 1, wherein when the second rotating member rotated out of the accommodating portion, the protrusion pushes the rotating mechanism to rotate along the first direction.

3. The electronic device as claimed in claim 2, wherein the rotating mechanism further comprises:
    an axle disposed in the housing, connected to the protrusion;
    an elastic arm set connected to the axle; and
    an engaging portion disposed on the elastic arm set used to engage with the first rotating member,
    wherein when the protrusion pushes the rotating mechanism to rotate along the first direction, driving the engaging portion separated from the first rotating member.

4. The electronic device as claimed in claim 3, wherein the first rotating member comprises a main body and a corresponding engaging portion disposed on the main body used to engage with the engaging portion.

5. The electronic device as claimed in claim 3, wherein the elastic arm set comprises a first elastic arm and a second elastic arm respectively disposed on two sides of the protrusion.

6. The electronic device as claimed in claim 1, wherein when the second rotating member is rotated to be received the accommodating portion, the protrusion pushes the rotating mechanism to rotate along the second direction.

7. The electronic device as claimed in claim 6, wherein the rotating mechanism further comprises:
    an axle disposed in the housing, connected to the protrusion;
    an elastic arm set connected to the axle; and
    an engaging portion disposed on the elastic arm set used to engage with the first rotating member.

8. The electronic device as claimed in claim 7, wherein the first rotating member comprises a main body and a corresponding engaging portion disposed on the main body used to engage with the engaging portion.

9. The electronic device as claimed in claim 7, wherein the elastic arm set comprises a first elastic arm and a second elastic arm respectively disposed on two sides of the protrusion.

10. The electronic device as claimed in claim 1, further comprises an antenna structure disposed on an inner surface of the first rotating member.

11. The electronic device as claimed in claim 1, wherein the second rotating member comprises a universal serial bus port, an IEEE-1394 interface or a serial advanced technology attachment.

12. The electronic device as claimed in claim 1, further comprising an elastic member disposed between the first rotating member and the housing.

13. The electronic device as claimed in claim 12, wherein the elastic member is a torsion spring or a coil spring.

14. The electronic device as claimed in claim 1, wherein the electronic device is a wireless data card.

15. The electronic device as claimed in claim 2, wherein when the second rotating member is rotated to be received the accommodating portion, the protrusion pushes the rotating mechanism to rotate along the second direction.

16. The electronic device as claimed in claim 15, wherein the rotating mechanism further comprises:
    an axle disposed in the housing, connected to the protrusion;
    an elastic arm set connected to the axle; and
    an engaging portion disposed on the elastic arm set used to engage with the first rotating member.

17. The electronic device as claimed in claim 16, wherein the first rotating member comprises a main body and a corresponding engaging portion disposed on the main body used to engage with the engaging portion.

18. The electronic device as claimed in claim 16, wherein the elastic arm set comprises a first elastic arm and a second elastic arm respectively disposed on two sides of the protrusion.

* * * * *